(12) United States Patent
Derkits, Jr. et al.

(10) Patent No.: US 6,555,457 B1
(45) Date of Patent: Apr. 29, 2003

(54) METHOD OF FORMING A LASER CIRCUIT HAVING LOW PENETRATION OHMIC CONTACT PROVIDING IMPURITY GETTERING AND THE RESULTANT LASER CIRCUIT

(75) Inventors: Gustav E. Derkits, Jr., New Providence, NJ (US); William R. Heffner, Sinking Spring, PA (US); Padman Parayanthal, Clinton Township, NJ (US); Patrick J. Carroll, Fleetwood, PA (US); Ranjani C. Muthiah, Allentown, PA (US)

(73) Assignee: Triquint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/545,494

(22) Filed: Apr. 7, 2000

(51) Int. Cl.⁷ .............................................. H01L 21/44
(52) U.S. Cl. ..................... 438/597; 438/98; 438/473; 438/476; 438/602; 438/603; 438/604; 438/605; 438/606; 438/607; 438/608; 438/609
(58) Field of Search ...................... 438/98, 402, 473, 438/476, 597, 599, 602, 603, 604, 605, 606, 607, 608, 609, 618, 621, 662, 686

(56) References Cited

U.S. PATENT DOCUMENTS

| | | |
|---|---|---|
| 3,874,936 A | 4/1975 | d'Hervilly et al. |
| 3,965,279 A | 6/1976 | Levinstein et al. |
| 5,013,685 A | 5/1991 | Chiu et al. |
| 5,063,174 A | 11/1991 | Beyea et al. |
| 5,160,793 A | 11/1992 | Zheng |
| 5,291,507 A | 3/1994 | Haase et al. |
| 5,294,834 A | 3/1994 | Fatemi et al. |
| 5,358,899 A | 10/1994 | Fleischman et al. |
| 5,396,103 A | 3/1995 | Oiu et al. |
| 5,412,249 A | 5/1995 | Hyugaji et al. |
| 5,424,244 A | 6/1995 | Zhang et al. |
| 5,426,061 A | 6/1995 | Sopori |
| 5,525,837 A | 6/1996 | Choudhury |
| 5,578,502 A * | 11/1996 | Albright et al. ................ 437/4 |
| 5,646,069 A | 7/1997 | Jelloian et al. |
| 5,770,489 A | 6/1998 | Onda |
| 5,841,197 A | 11/1998 | Adamic, Jr. |
| 5,849,630 A | 12/1998 | Johnson |
| 5,909,051 A | 6/1999 | Stockman et al. |
| 6,037,663 A | 3/2000 | Yagura et al. |
| 6,361,619 B1 * | 3/2002 | Falster et al. ................ 438/473 |

FOREIGN PATENT DOCUMENTS

EP          09045898      2/1997

\* cited by examiner

*Primary Examiner*—John F. Niebling
*Assistant Examiner*—Lynne Ann Gurley
(74) *Attorney, Agent, or Firm*—Dickstein Shapiro Morin & Oshinsky LLP

(57) ABSTRACT

A novel contact structure and method for a multilayer gettering contact metallization is provided utilizing a thin layer of a pure metal as the initial layer formed on a semiconductor cap layer. During formation of the contact structure, this thin metal layer reacts with the cap layer and the resulting reacted layer traps mobile impurities and self-interstitials diffusing within the cap layer and in nearby metal layers, preventing further migration into active areas of the semiconductor device. The contact metallization is formed of pure metal layers compatible with each other and with the underlying semiconductor cap layer such that depth of reaction is minimized and controllable by the thickness of the metal layers applied. Thin semiconductor cap layers, such as InGaAs cap layers less than 200 nm thick, may be used in the present invention with extremely thin pure metal layers of thickness 10 nm or less, thus enabling an increased level of integration for semiconductor optoelectronic devices. In addition, because pure metal layers are used in the ohmic contact, fewer impurities are introduced in the formation of the contact than with prior art alloy contacts.

15 Claims, 6 Drawing Sheets

METHOD OF FORMING A LASER CIRCUIT HAVING LOW PENETRATION OHMIC CONTACT PROVIDING IMPURITY GETTERING AND THE RESULTANT LASER CIRCUIT

BACKGROUND OF THE INVENTION

1. Field of the Invention

The present invention relates generally to the field of ohmic contacts for semiconductor electronic devices and, more particularly, to a low-penetration ohmic contact providing a gettering function to remove impurities from semiconductor devices and to a method of forming it.

2. Description of the Related Art

In recent years, communications systems have been developed in many parts of the world that take advantage of optical fiber technology to increase the speed of information transfer. Demand for ever-higher information transfer rates has resulted in pressure to advance the state of the art of optoelectronic communications technology, including the design and manufacturing of semiconductor lasers.

Semiconductor lasers are the power sources for optoelectronic communications. They transform electronic signals into light with specific properties of intensity and spectral purity designed to allow for transmission of information over optical fiber networks. Although prior art semiconductors most commonly employed the elements Si and Ge, listed in Group IV of the Periodic Table, other materials, such as intermetallic compounds, have also been found to exhibit properties useful in the formation of semiconductor lasers.

Modern semiconductor lasers are precision devices in which many layers of semiconductors are used to control the flow of current and light. The device may have as many as twenty or more semiconductor substructures and require up to 4 or 5 crystal growth steps. The active region of the laser, the area in which the conversion of electrons and holes to photons occurs, may be made up of a number of substructures called quantum wells, some of which may be only 10 atoms thick.

In order to provide high efficiency of conversion of electrical to optical power, the electrical fields inside the active region should be controlled. This implies a high degree of control of the dopant impurities in the neighborhood of the active region. Impurities deliberately introduced into the semiconductor to modify the carrier density and control conductivity type should be controlled with respect to position and density to a high degree of spatial precision—a few nanometers (nm).

The contact metallization, or the part of the laser that interfaces with the outside world to provide chemical barriers and electrical contacts, has generally received less attention in design efforts than the active region itself. Designs for the contact structure have been nearly frozen for a long time. However, in recent years it has become apparent that the control of dopant diffusion into the active region requires that the other layers be optimized with respect to thickness and doping density. This has in turn placed additional requirements on the contact metallization, or ohmic contact.

Ohmic contacts to semiconductor devices are the point at which the outside world in the form of electricity flowing in wires influences the semiconductor. In addition to the obvious function of conducting electricity, ohmic contacts provide chemical isolation of the active region from impurities that can affect device performance. These impurities are often generated by further processing of the device during manufacturing or during normal usage. Ohmic contacts also provide an important path for heat to escape from the active region, and they may also be required to provide mechanical isolation of the device during bonding processes. To perform these functions, the contact structure applied to the semiconductor may be comprised of many layers, all of which should be compatible with each other and with the semiconductors and other elements of the device.

In modern ohmic contacts, the ohmic function is provided by one or a few layers of metal and the other functions (chemical barrier, mechanical protection, etc.) are provided by other layers specifically aimed at those purposes. Ohmic metallization recipes of the "alloyed" type incorporate a solvent metal such as Au which reacts strongly with the semiconductor and a dopant element such as Sn or Ge for N-type III-V materials and Be or Zn for P-type materials. The purpose of the solvent is to break up the semiconductor and form a strong physical bond. The purpose of the dopant is to increase the concentration of acceptors or donors in the immediate neighborhood of the interface and thereby reduce the contact resistance. Such an "alloyed" ohmic contact recipe is primarily designed to optimize contact resistance.

The classic ohmic contact used in many current optoelectronic devices is produced using an alloyed ohmic contact recipe and consists of Au and Be. This contact is used for P-type materials and consists of an alloy of Au and Be which is evaporated as a single film from a source of mixed metal. The Au is a solvent and the Be a P-type dopant. The vapor pressures of Au and Be are similar enough to allow material of essentially constant composition to be applied by physical evaporation, typically in an vacuum chamber at pressures below $5 \times 10^{-7}$ Torr using an electron-beam gun as a power source. The AuBe alloy is applied to the semiconductor through a patterned photoresist mask and the excess metal lifted off when the photoresist is dissolved in acetone. The AuBe layer is then annealed (heated) at a temperature of 350–420 degrees Celsius to form the metallurgical bond and other metal layers are applied in subsequent fabrication steps to form the protective barrier and mechanical bond layers.

At the end of the complete metallization process, the metals in the stack may comprise up to 5 microns of metal in 7 to 10 distinct layers. For example, a typical metallization might have the sequence: AuBe\Ti\Pt\Au\Au\Pt\Au (i.e., AuBe is first deposited, Ti is deposited on the AuBe, Pt is deposited on the Ti, etc.), in which the AuBe layer functions as the ohmic contact interface to the semiconductor, the sequence Ti\Pt\Au functions as the barrier metallization for chemical protection, and the sequence Au\Pt\Au functions as the bonding layer for mechanical protection. It is desirable to use Au as a final layer of a metal sequence which will be exposed to air or processing materials. This is because Au is the least reactive and most easily cleaned metal.

Between the semiconductor and the metal layers, a layer of low-bandgap, lattice-matched semiconductor is often applied as the final "cap layer" interface to reduce the Schottky barrier height and further facilitate the contact. In the case of the InGaAsP alloy system, the lattice-matched material is InGaAs. An additional benefit of using InGaAs as the cap layer is that it has a higher solubility for the preferred P-dopant Zn than does InP.

However, the use of an InGaAs cap layer presents a hazard of introducing additional impurities into the active region of the semiconductor. Uncontrolled diffusion of Zn, an impurity, in the neighborhood of the active region occurs mainly during the growth of the InGaAs cap layer. Therefore, it is desirable to minimize the amount of time spent forming the cap layer, thus reducing the desired cap layer thickness. In the past, most laser devices used a 500 nm thick cap layer. Recently, this was reduced to 200 nm and more recently to a minimum of 50 nm.

Because of the concern to reduce the thickness of the InGaAs cap layer, development efforts were aimed at producing a "low penetration contact" which was designed to react with a controlled minimum amount of semiconductor. The depth of reaction with the semiconductor is controlled by the thickness of the layers of metallization which interacted directly with the semiconductor. The idea is that the complete reaction of the layers of metal which combine with the semiconductor consumes only a small amount of semiconductor cap layer material. In order to make sure that the total penetration of the metal is kept to a desired limit, it is necessary to use very thin layers at the semiconductor/metal interface. For purposes of manufacturability, it is desirable that the very thin layers be made of single elements, not alloys, mixtures, or compounds.

The classic AuBe ohmic contact was found to be unsuitable for use with thin (approximately 50 nm) InGaAs cap layers. The depth of reaction of AuBe with the cap layer is highly variable, sometimes resulting in excess penetration of AuBe into the underlying InP substrate. Thus, a thick cap layer of about 200 nm or more is usually required for satisfactory reliability of the AuBe contact.

In addition to the Zn impurity hazard, Copper (Cu) is an even more dangerous impurity for InGaAsP semiconductor devices. Even at very low levels, Cu ions act as efficient destroyers of electrons and holes via a process called non-radiative recombination. Cu also diffuses rapidly through the semiconductor. Cu is most often introduced as an impurity in the contact metallization, either in the original AuBe source material or due to processing steps. Thus it is desirable to use metallization source materials unlikely to contain Cu impurities. Cu impurities are often present in the AuBe source metal, degrading reliability of the resulting semiconductor device and requiring extensive composition control of the alloy during contact formation. These problems are distinctly alloy-related; they are not significant in contact recipes using only pure metal layers.

An ohmic contact recipe containing pure metal layers was proposed for use with thin InGaAs cap layers in U.S. patent application Ser. No. 09/017,103, which is hereby incorporated by reference herein. In this application, a contact metallization with sequence Pt\Ti\Pt\Au\Ti\Pt\Au\Au\Pt\Au was used and tested with a 50 nm thick InGaAs cap layer on a III-V semiconductor device. This metallization sequence effectively replaces the AuBe alloy with a sequence of pure metal layers: Pt\Ti\Pt\Au. The resulting contact showed excellent contact resistivity, very low depth of reaction into the cap layer, and was thought to contain few impurities.

However, detailed analysis of this contact metallization suggested that the resulting device may be further improved. Secondary ion mass spectroscopy (SIMS) and Auger electron spectroscopy showed indications that Zn impurities in the InGaAs cap layer, which were deliberately introduced as a dopant during epitaxial growth of the cap layer, did not appear to migrate upward from the p-type semiconductor material, including the cap layer, as may have happened in the AuBe layer of the classic AuBe contact during alloying. Improvements in device reliability could be obtained if Zn migration into the pure metal layers could be encouraged with this metallization.

Therefore, there is a desire and need for an ohmic contact recipe compatible with thin (50 nm) InGaAs cap layers, containing few impurities, exhibiting minimal resistivity, made of single elements capable of being manufactured in extremely thin layers, and resulting in devices showing improved reliability characteristics.

SUMMARY OF THE INVENTION

The present invention provides a novel ohmic contact metallization structure and method utilizing a thin pure metal layer designed to react with the semiconductor cap layer to getter Zn and other interstitial impurities. The resulting contact structure exhibits favorable reliability and resistivity characteristics and enables a higher level of integration for semiconductor devices by permitting the use of very thin layers in a low-penetration contact structure.

The present invention also provides an alternative to the prior art design scheme for ohmic contact structures. Prior art contact structure design was primarily concerned with minimizing contact resistance. The present invention provides an improved ohmic contact design scheme in which device reliability is the primary design goal, rather than minimal contact resistance. An ohmic contact metallization recipe showing improved reliability, excellent resistivity, and increased levels of integration can be obtained using the present invention.

The above and other features and advantages of the invention are achieved by forming a multilayer gettering contact metallization including a thin layer of a metal as the initial layer formed on the semiconductor cap layer for trapping impurities, dopants and self-interstitials. During formation of the contact structure, impurities, self-interstitials and other defects present in the cap layer and in other nearby layers diffuse into metal layers forming the contact structure, preventing further migration into active areas of the semiconductor device. The contact metallization is formed of pure metal layers compatible with each other and with the underlying semiconductor cap layer such that depth of reaction is minimized (low-penetration) and controllable by the thickness of the metal layers applied. Thin semiconductor cap layers, such as InGaAs cap layers less than 200 nm thick, may be used in the present invention with extremely thin pure metal layers of thickness 10 nm or less, thus enabling an increased level of integration for semiconductor optoelectronic devices. In addition, because pure metal layers are used in the ohmic contact, fewer impurities are introduced in the formation of the contact than with prior art alloy contacts.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

In the following description, reference is made to exemplary materials used in one embodiment of the present invention and exemplary devices formed using such an embodiment. However, other materials may be used and other devices may be constructed using the teachings of the present invention as will be understood by those skilled in the art. In particular, materials used in the present invention are not limited to the compound semiconductors discussed and may include non-compound semiconductors or compound semiconductors formed from alternate combinations of elements, such as those in columns II and IV of the periodic table. Also, the devices in which the present invention may be included are not limited to optoelectronic emitters, but may include optoelectronic absorbers or receivers, modulators, or any other semiconductor device for which increased levels of integration and reliable electrical connection would be useful.

Figure 1:
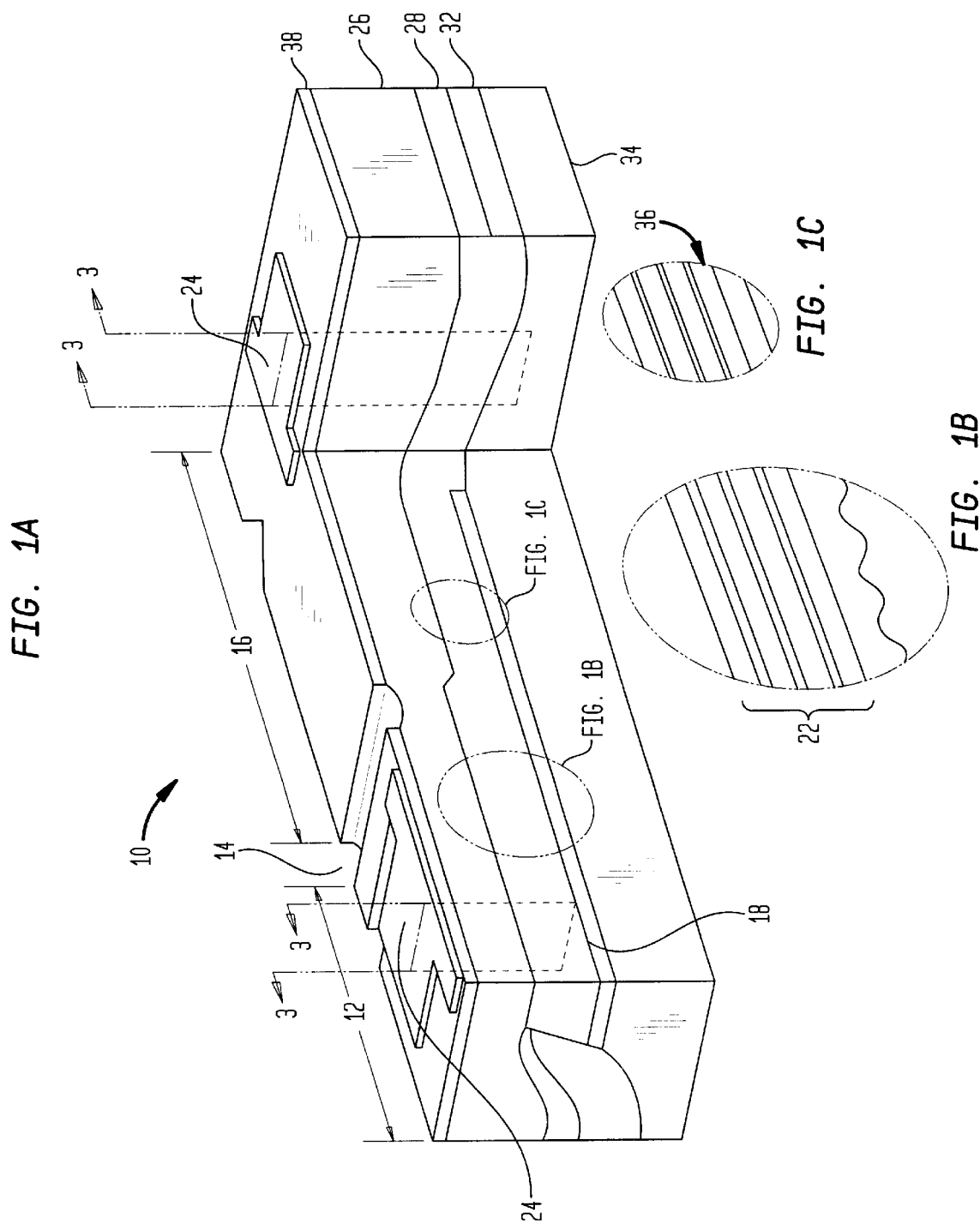
FIG. 1 illustrates a partial cross-sectional view of an electroabsorption modulated laser (EML) with a contact metallization formed in accordance with the present invention.

FIG. 1 shows an electroabsorption modulated laser (EML) 10 with contact metallization sections 24. Contact metallization sections 24 are formed in vias etched in dielectric barrier layer 38 that was earlier deposited on semiconductor cap layer 26. Semiconductor cap layer 26 is formed on cladding layer 28 that is in turn formed on buffer layer 32. Underlying the above layers is semiconductor substrate 34. The EML 10 is commonly described in sections, including distributed feedback (DFB) laser section 12, trench 14, and electroabsorption (EA) modulation section 16. DFB laser section 12 contains multiple quantum-well (MQW) layers 22 and passive waveguide (grating) 18. EA modulation section 16 includes active modulation layers 36.

When electric current above the threshold level (Ith) is applied to the contact metallization section 24, the active MQW layers 22 transduce charge carriers into photons, converting input electrical power into output optical power. The passive waveguide 36 then transfers the optical power to the EA modulator section 16. The EA modulation section 16 controls the output optical power by changing the amount of power absorbed from the photon beam by adjusting the electric field in the cavity or trench 14. The modulated optical signal exits out of the modulator facet and is coupled into the optical fiber link of a communications system (not shown in FIG. 1; see, e.g., FIG. 8).

Contact metallization sections 24 are customarily formed after the other components of the EML 10 shown in FIG. 1. Prior to formation of the contact metallization sections 24, the other sections of EML 10 are formed through processes of semiconductor formation well known in the art. Because the formation of contact metallization sections 24 may introduce impurities and other defects that degrade the performance of the EML 10, the process of contact formation should be designed to minimize impurity introduction or diffusion.

Figure 2:
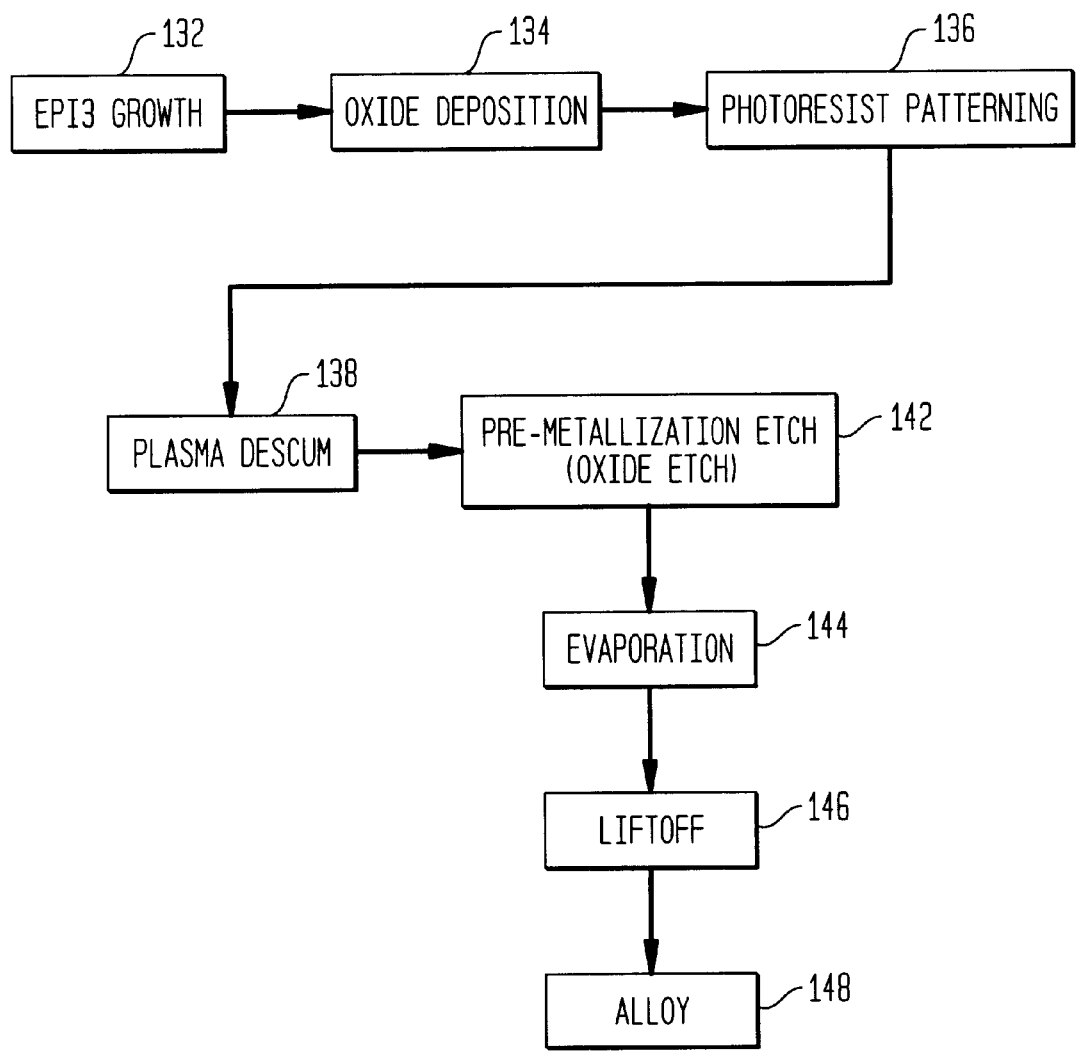
FIG. 2 illustrates a block diagram of a method of forming a multilayer contact metallization in accordance with the present invention.

The process of contact formation of the present invention is described in FIG. 2. The method begins with the formation of the semiconductor cap layer 26 (see FIG. 1) in the Epi3 Growth step 132. The cap layer 26 (see FIG. 1) is formed from a low-bandgap semiconductor, preferably InGaAs, that is doped, preferably with Zn, to increase its conductivity and hence reduce resistivity. The cap layer 26 may alternatively be doped with other conductivity-enhancing dopants, such as carbon.

The cap layer is epitaxially grown and lattice-matched to the underlying semiconductor layers. The dielectric barrier layer 38 (see FIG. 1) is formed on top of the cap layer 26 (see FIG. 1) in the Oxide Deposition step 134. The dielectric barrier layer 38 may be formed from an insulator capable of protecting the underlying cap layer 26, such as an oxide or a nitride.

A photoresist is then applied as a mask exposing only the metallization sections 24 during the Photoresist Patterning step 136. After the photoresist is patterned and exposed, developer is used to remove exposed areas of the photoresist followed by a Plasma De-Scum step 138 to remove very small quantities of resist that remain in unwanted areas. The dielectric barrier layer 38 underlying the exposed areas is then etched in the Pre-Metallization Etch step 142 to expose the semiconductor cap layer 24 in the metallization section 24.

The pure metal layers of the contact metallization are formed during the Evaporation step 144 and any excess metal lifted off in the Liftoff step 146 when the remaining photoresist is dissolved in acetone. Finally, the wafer is heated or annealed during the alloy step 148 to facilitate the reaction of the pure metal layers with the cap layer 26. Formation of the pure metal layers in step 144 and the subsequent thermal treatment are described in more detail in FIGS. 3–6.

Figure 3:
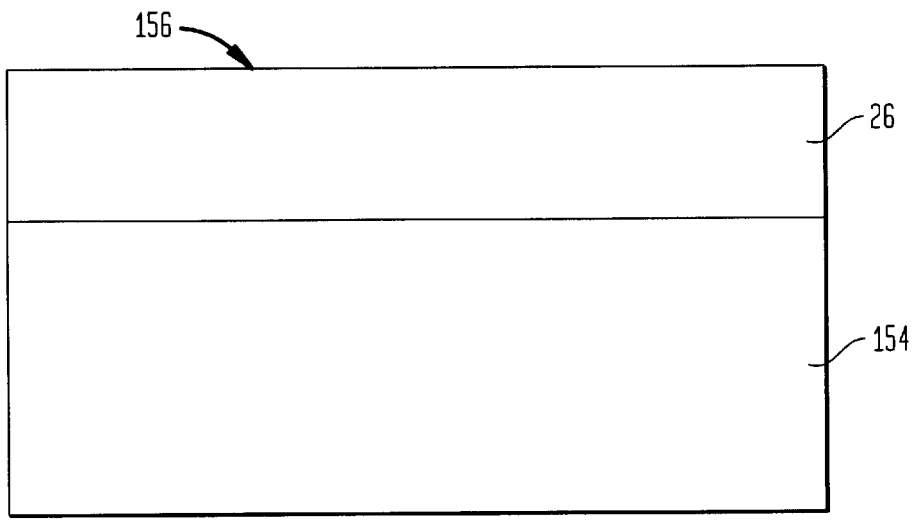
FIG. 3 illustrates a partial cross-sectional view of a semiconductor structure at an early stage in the formation of a multilayer contact metallization in accordance with the present invention.
Figure 4:
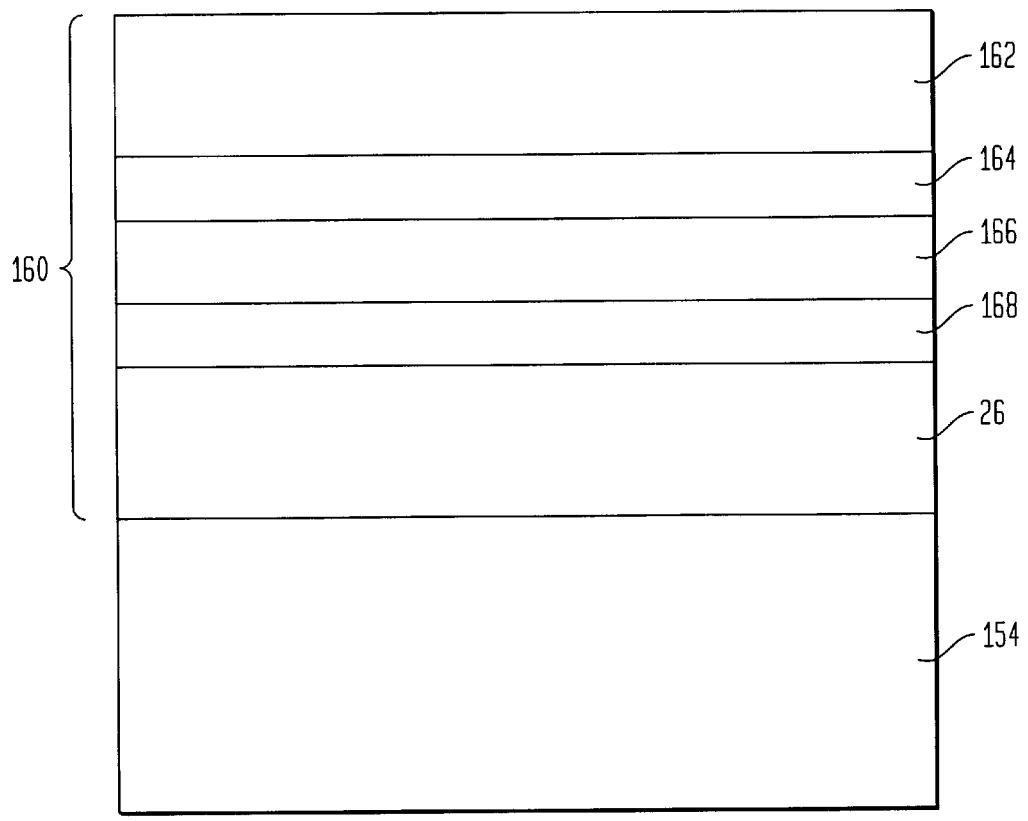
FIG. 4 illustrates a partial cross sectional view of the structure of FIG. 3 at a later stage of formation.

FIGS. 3–6 show a partial cross-section of the contact metallization sections 24 (see FIG. 1) during fabrication. FIG. 3 shows a partial cross-sectional view corresponding to section lines 3—3, shown in FIG. 1 at two contact metallization locations. Referring to FIG. 3, semiconductor cap layer 26 is shown formed on a multilayer structure of semiconductor materials 154, which may represent different semiconductor layer sequences depending on which of the two metallization sections 24 shown in FIG. 1 is described. Regardless of which of the metallization sections 24 is described, tie metallization sequence formed on it is identical, as described below. Clean surface 156 results from the Pre-Metallization Etch step 142 (see FIG. 2) and is the surface on which the pure metal layers are formed as shown in FIG. 4.

Cap layer 26 contains impurities, dopants, and point defects, including "self-interstitials," some intentionally included to reduce resistivity and enhance conductivity. A "self-interstitial" defect in a crystal structure is an atom or combination of atoms at a position away from its equilibrium position in the lattice. A self-interstitial can exchange positions with Zinc and other impurities and hence represent a potential defect where they occur. Self-interstitials have been implicated as causes of performance degradation for semiconductor devices.

Referring to FIG. 4, multilayer gettering contact metallization 160 is formed from metallization layers 162, 164, 166 and 168 and a portion of semiconductor cap layer 26. Multilayer semiconductor structure 154 is shown underlying the contact metallization structure. Multilayer gettering contact metallization 160 is produced by forming first metallization layer 168 on cap layer 26, second metallization layer 166 on first metallization layer 168, third metallization layer 164 on second metallization layer 166, and fourth metallization layer 162 on third metallization layer 164.

In a preferred embodiment, first metallization layer 168 is formed from pure Gold (Au) with a thickness of between about 1 nm to 11 nm, second metallization layer 166 is formed from a low-electronegativity metal (see below) such as pure Titanium (Ti) with a thickness of between about 30 nm to 70 nm, third metallization layer 164 is formed from a high-electronegativity metal such as pure Platinum (Pt) with a thickness of between about 30 nm to 70 nm, and fourth metallization layer 162 is formed from pure Gold (Au) with a thickness between about 50 nm to 300 nm.

In alternate embodiments, second metallization layer 166 may be formed from any low-electronegativity metal and third metallization layer 164 may be formed from any high-electronegativity metal. As discussed in more detail in U.S. patent application Ser. No. 09/017,103, previously incorporated by reference, a "low-electronegativity" metal tends to form a strong bond with a "high-electronegativity" metal and the combination provides improved protection against diffusion of defects, impurities and self-interstitials. Exemplary high-electronegativity metals include platinum, palladium and rhodium. Exemplary low-electronegativity metals include titanium, hafnium, zirconium, scandium, lanthanum and cerium.

Metallization layers 162, 164, 166, and 168 are preferably formed by electron-beam evaporation. The wafer is placed in a vacuum chamber at pressures below $5 \times 10^{-7}$ Torr and all four metallization layers 162, 164, 166 and 168 are applied in sequence in a single evaporation without breaking vacuum. The metallization layers 162, 164, 166 and 168 are applied by physical evaporation from a pure metal source for each layer using an electron-beam gun as a power source. After metallization layers 162, 164, 166 and 168 are formed, multilayer gettering contact metallization 160 is heated or annealed to expedite the alloying reaction of the metallization layers 164, 166, and 168 with each other and with a portion of cap layer 26, resulting in the structure described below with reference to FIG. 5.

The alloy step 148 (see FIG. 2) consists of heating the metallization section 24 (see FIG. 1) or alternatively the entire EML 10 to a temperature sufficient to cause the reaction of the metallization layers 168, 166, and 164 with each other and with the cap layer 26. This alloy step 148 is also referred to as "annealing" the metal layers. In the embodiment using a pure metal sequence of Au\Ti\Pt\Au as the metallization layers 168, 166, 164 and 162, respectively, and when InGaAs doped with Zn is the semiconductor cap layer 26 (i.e., p-type contact), the wafer is heated to a temperature of 350 degrees Celsius for between about 0.25 minutes to 7 minutes. This heating cycle may be repeated to later alloy the n-type contact. An additional heating step may be conducted during later bonding and packaging operations in which the wafer is heated to a temperature of 360 degrees Celsius for up to 4 minutes. One advantage of the low-penetration contact of the present invention is that the p-type contact formed in the initial alloy is stable with respect to its electrical and reliability characteristics even during later heating and manufacturing steps.

As presently understood, the metallization layers 162, 164, 166 and 168 chemically react with each other and with the cap layer 26. However, the present invention is not necessarily bound by any theory, and other theoretical mechanisms may be compatible with the present apparatus and method. In the discussion above and below, references to a reaction should be taken accordingly.

Figure 5:
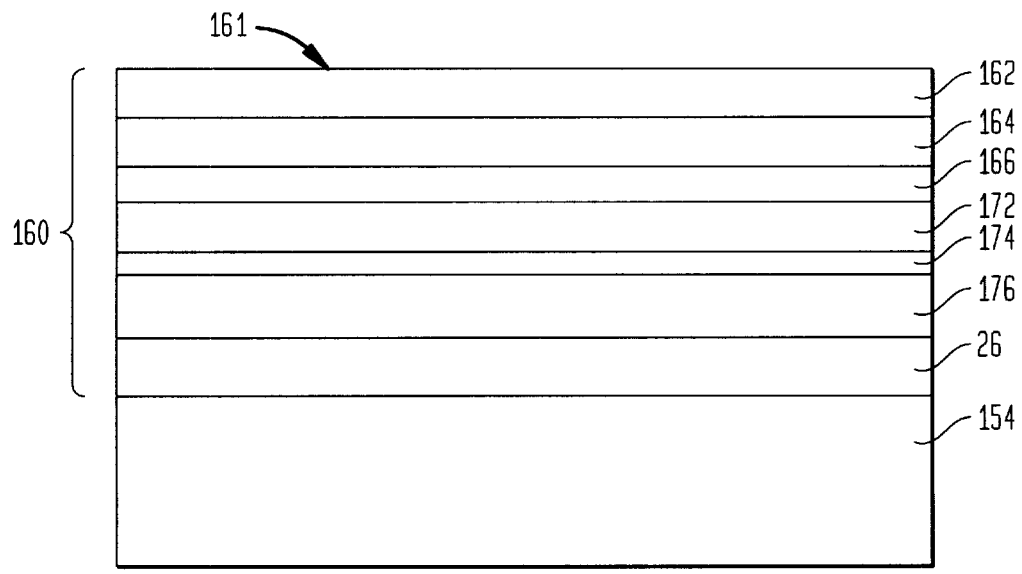
FIG. 5 illustrates a partial cross-sectional view of the structure of FIGS. 3 and 4 at a later stage of formation.

FIG. 5 illustrates the structure that results after the alloy step 148 (see FIG. 2) and the reaction of the metallization layers 164, 166 and 168 with each other and with the cap layer 26. As presently understood, this reaction results in first reacted layer 176 formed adjacent cap layer 26, second reacted layer 174 formed adjacent first reacted layer 176, and third reacted layer 172 formed adjacent second reacted layer 174. Cap layer 26 and second and third metallization layers 166 and 164 are shown with reduced thickness to illustrate the reaction's consumption of a portion of those layers. Portions of these layers 26, 166, 164 remaining unconsumed by the reaction remain in their respective positions from prior to the alloy step 148. Fourth metallization layer 162 remains unreacted with underlying layers and has an external surface 161 exposed for formation of further contact metallization layers such as chemical barrier layers or mechanical protection layers, as described below with reference to FIG. 6.

Reacted layers 172, 174 and 176 are formed by the reaction of metallization layers 168, 166 and 164 with each other and with cap layer 26. In one embodiment of the present invention, first metallization layer 168 reacts with cap layer 26 and may react with second metallization layer 166. Second metallization layer 166 may react with metallization layer 168, cap layer 26, and third metallization layer 164. Third metallization layer 164 may react with second metallization layer 166. The above reactions result in the formation of reacted layers 176, 174 and 172, as several distinct layers discernible only under high-power magnification (i.e. using transmission electron microscope or equivalent). For the embodiment using InGaAs as the cap layer 26 and Au\Ti\Pt\Au as the sequence of metallization layers 168, 166, 164 and 162, respectively, first reacted layer 176 may contain at least Ti and As, second reacted layer 174 may contain at least In, Au and As, and third reacted layer 172 may contain at least Ti, Ga and Au.

Note that the metals of layers involved in the reaction may appear to migrate to new positions after the reaction. This can occur when the layer is completely consumed in the reaction. For example, in the exemplary embodiment described above, after the alloy step 148, Au is contained only in layers not in contact with the cap layer 26, but Au was initially deposited directly on the cap layer 26.

The amount of cap layer 26 that reacts with the metallization layers 168, 166 determines whether the contact formed is "high-penetration" or "low-penetration." The more cap layer 26 involved in the reaction, the higher the penetration. Excess penetration into the cap layer 26 is undesirable, because if the cap layer 26 is formed too thin, contamination of the semiconductor layers 154 can result and negatively affect device reliability. However, some metallizations penetrate less than others, and thus an approximate minimum cap layer thickness may be determined for each metallization recipe. For example, the prior art AuBe metallization penetrates more than the metallization of the present invention. Reliable AuBe contacts require a cap layer 26 at least 200 nm thick. In comparison, reliable contacts with a 50 nm thick cap layer 26 have been formed using the Au\Ti\Pt\Au metallization. Careful control of the reaction time and temperature can also aid in controlling penetration of the cap layer 26.

During the reaction of the metallization layers 164, 166 and 168 with each other and with the cap layer 26, mobile impurities and self-interstitials in the cap layer 26 and in other nearby layers diffuse into and are trapped by the reacted layers. Due to the trapping action of the reacted layers, the impurities and self-interstitials migrate toward the reacted layers and out of the semiconductor cap layer 26 and underlying semiconductor layers 154. Any later heat-treatment steps also facilitate this migration, but such later steps are not required after the initial reaction during the alloy step 148 (see FIG. 2). This migration of mobile impurities and self-interstitials is known as "gettering" and helps improve the performance characteristics of the device. The gettering property of the multilayer gettering contact metallization 160 improves contact reliability and reduces manufacturing variability of semiconductor devices formed in accordance with the present invention.

Again, in the above discussion, references to a reaction should be interpreted in light of the presently understood theory of formation. However, the present invention is not necessarily bound by any theory, and other theoretical mechanisms may be compatible with the present apparatus and method. In the discussion above and below, references to a reaction should be taken accordingly.

Figure 6:
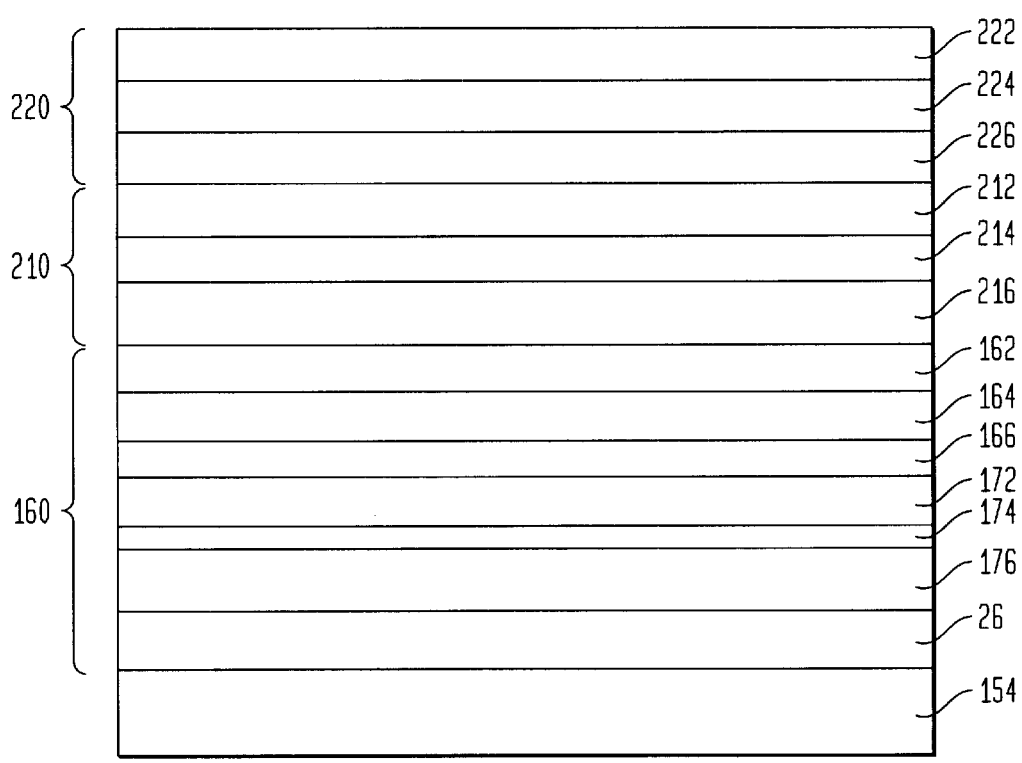
FIG. 6 illustrates a partial cross-sectional view of the structure of FIGS. 3–5 at a later stage of formation.

After the formation of the multilayer gettering contact metallization 160, several additional metal layers are deposited on it. FIG. 6 shows the final metallization 200 including the multilayer gettering contact metallization 160 as well as a barrier metallization 210 and a mechanical/bonding metallization 220. Barrier metallization 210 may be formed of metal layers 212, 214, 216 that provide chemical isolation of the underlying active areas from impurities that are often generated by further processing or normal usage. In particular, barrier metallization 210 may be formed of materials capable of preventing diffusion of bonding metals, e.g. tin, copper or nickel, into the device and also of preventing diffusion of semiconductor, e.g. In, atoms out of the device. For the Au\Ti\Pt\Au contact metallization, an exemplary barrier metallization would be Ti\Pt\Au for layers 216, 214, 212, respectively.

Mechanical/bonding metallization 220 is formed of metal layers 222, 224, 226 that provide mechanical isolation of the underlying layers during bonding processes used for electrical connections. In particular, the mechanical/bonding metallization is preferably formed of materials capable of absorbing bonding stresses and preventing penetration of solder into underlying layers. A layer of Au is customarily used as the top mechanical/bonding layer 222 which will be exposed to air or processing materials since it is the least reactive and most easily cleaned metal. For the Au\Ti\Pt\Au contact metallization and Ti\Pt\Au barrier metallization, an exemplary bonding metallization would be Au\Pt\Au for layers 226, 224, 222, respectively. In addition to chemical and mechanical isolation, the structure consisting of contact metallization 160, barrier metallization 210 and mechanical/bonding metallization 220 also provides a path for heat to escape from the active areas of the underlying semiconductor 154.

Figure 7:
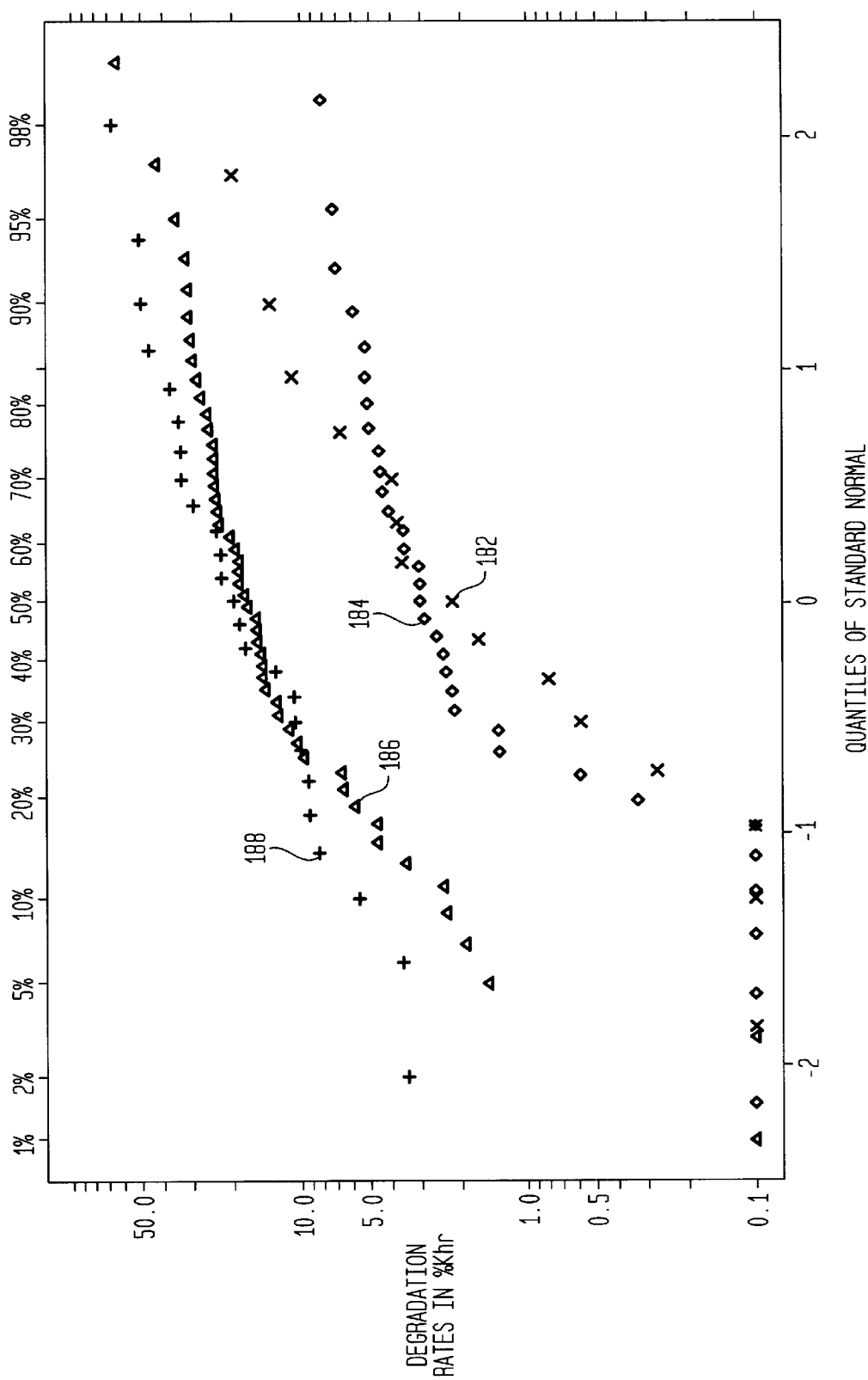
FIG. 7 illustrates a graph of degradation rates comparing aging characteristics of the prior art with aging characteristics of a multilayer contact metallization formed in accordance with the present invention.

FIG. 7 shows the results of aging tests performed for both the prior art AuBe contact metallization and the Au\Ti\Pt\Au contact metallization of the present invention. Each point on the graph represents a EML semiconductor laser 10 (see FIG. 1) tested in an accelerated aging environment to determine the laser's rate of degradation. This is accomplished by subjecting the devices to higher temperature (100 degrees Celsius), and more stressful bias conditions than actual use conditions. The EML DFB laser section (see FIG. 1) was forward biased to maintain 200 mA current and the modulator section was kept at a reverse bias of −5.0 V. The laser degradation was monitored by periodically lowering the temperature and measuring the light output at a fixed current.

The y-axis of FIG. 7 represents the degradation rate of each laser, in units of % degradation per thousand hours. The x-axis represents deviation from standard normal for the testing sample (bottom of chart) or alternatively the equivalent percentage of lasers in the sample exhibiting this degradation behavior (top of chart). Data trends 186 and 188 represent lasers constructed with the prior art AuBe contact metallization, and data trends 182 and 184 represent lasers constructed with the multilayer gettering contact metallization 160 (see FIG. 5) with sequence Au\Ti\Pt\Au in accordance with the present invention.

Referring to the y-axis shown in FIG. 7, lower is better for degradation rates, and hence data trends 182 and 184 for the present invention show an improvement over degradation rate trends 186 and 188 for the prior art. The median degradation rate for lasers with the contact metallization of the present invention was between about 2.12 and 2.94%/Khr, while the degradation rate for prior art lasers was between about 17.3 and 19.59%/Khr. The present invention provides significant improvement in degradation rates.

The contact metallization of the present invention thus allows for increased levels of integration of the underlying semiconductor by its use of thin metallization layers and its compatibility with a thin semiconductor cap layer, exhibits improved reliability characteristics as described above, and has a suitably low contact resistance. For example, for a cap layer doped with Zn, the resulting device shows a contact resistance equivalent to that of the prior art AuBe contact structure. Contact resistance is controlled by the concentration of active dopant in the cap layer and may be even further reduced if a low-diffusion dopant such as Carbon is used instead of Zn.

Figure 8:
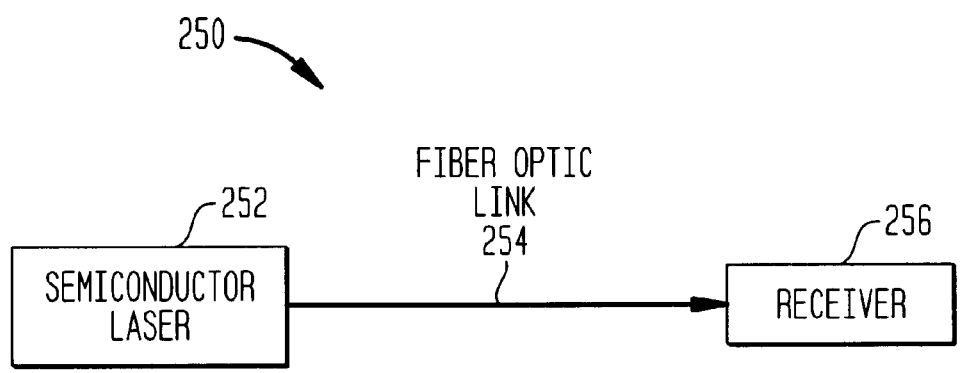
FIG. 8 illustrates a schematic diagram of an optoelectronic communications system formed in accordance with the present invention.

FIG. 8 illustrates an exemplary communications system 250 constructed in accordance with the present invention. Communications system 250 includes a semiconductor laser 252, a laser signal receiver 256, and an optical fiber link 254. The semiconductor laser 252 includes a multilayer gettering contact metallization as described above. System 250 operates by transmitting communications data from laser 252 to receiver 256 through the fiber link 254, which acts as a conduit. Data to be transmitted is transduced at laser 252 from electrical signals into photons which travel through the fiber link 254 to the receiver 256 which transduces the photons back into electrical signals.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of producing a multilayer gettering contact metallization in a laser semiconductor device having a cap layer, comprising the acts of:

forming a dielectric barrier layer on said cap layer;

removing portions of said dielectric barrier layer according to a pattern to expose portions of said cap layer;

forming a plurality of pure metal layers on said exposed cap layer portions, at least one of which is capable of gettering mobile impurities and self-interstitials present in said cap layer; and heating said plurality of pure metal layers to cause mobile impurities and self-interstitials in at least said cap layer to be gettered in said plurality of pure metal layers.

2. The method of claim 1 wherein said forming of said dielectric barrier layer includes forming said barrier layer using an oxide or a nitride.

3. The method of claim 1 wherein said forming of said pure metal layers includes electron-beam evaporation in a vacuum.

4. The method of claim 1 wherein said act of heating includes heating said metal layers at a temperature of about 350 degrees Celsius for between about 0.25 minutes to 7 minutes.

5. The method of claim 1 wherein said forming of said pure metal layers includes forming at least one layer of Gold, at least one layer of a low-electronegativity metal, and at least one layer of a high-electronegativity metal.

6. The method of claim 1 wherein said forming of said pure metal layers includes forming a first layer of Gold on said cap layer, a second layer of Titanium on said first layer, a third layer of Platinum on said second layer, and a fourth layer of Gold on said third layer.

7. The method of claim 6 wherein said first layer reacts with said cap layer, and said second layer reacts with said cap layer, said first layer, and said third layer.

8. The method of claim 6 wherein said forming of said first, second, third and fourth layers includes forming said first layer to a thickness of between about 1 nm to 11 nm, said second layer to a thickness of between about 30 nm to 70 nm, said third layer to a thickness of between about 30 nm to 70 nm, and said fourth layer to a thickness of between about 50 nm to 300 nm.

9. The method of claim 1 wherein said cap layer reacts with said plurality of metal layers to form at least a first layer and a second layer, said first layer containing at least Gold and Indium and said second layer containing at least Titanium and Gold.

10. The method of claim 1 wherein said metal layers react with a controlled amount of said cap layer, said controlled amount determined by a thickness of said metal layers formed on said cap layer, a time for which said metal layers are heated, and a temperature at which said metal layers are heated.

11. The method of claim 1 wherein said act of heating causes mobile impurities to be gettered including at least Zinc.

12. The method of claim 1 wherein said act of heating causes self-interstitials to be gettered including at least atoms of Indium or Gallium.

13. The method of claim 1 wherein said act of heating causes mobile impurities and self-interstitials to be gettered including atoms of at least one of the group consisting of Copper, Zinc, Indium and Gallium.

14. The method of claim 1 further comprising forming a barrier metallization on said plurality of metal layers, said barrier metallization including a first barrier layer of a low-electronegativity metal, a second barrier layer of a high-electronegativity metal, and a third barrier layer of Au.

15. The method of claim 14 further comprising forming a bonding metallization on said barrier metallization, said bonding metallization including a first bonding layer of Au, a second bonding layer of Pt, and a third bonding layer of Au.

* * * * *